(12) United States Patent
Hara

(10) Patent No.: US 7,410,908 B2
(45) Date of Patent: Aug. 12, 2008

(54) MANUFACTURING METHOD FOR A SEMICONDUCTOR DEVICE

(75) Inventor: Kazumi Hara, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/445,398

(22) Filed: Jun. 1, 2006

(65) Prior Publication Data

US 2006/0292887 A1 Dec. 28, 2006

(30) Foreign Application Priority Data

Jun. 24, 2005 (JP) ............................. 2005-184652

(51) Int. Cl.
*H01L 21/302* (2006.01)
(52) U.S. Cl. .................. 438/745; 750/754; 156/345.17
(58) Field of Classification Search ................ 438/745, 438/750, 754; 156/345.17
See application file for complete search history.

(56) References Cited

U.S. PATENT DOCUMENTS

2002/0026985 A1* 3/2002 Kai ........................... 156/345
2002/0048907 A1* 4/2002 Miyamoto et al. .......... 438/464
2004/0080047 A1* 4/2004 Wada et al. ................. 257/738
2005/0257889 A1* 11/2005 Yamasaki et al. ....... 156/345.17

FOREIGN PATENT DOCUMENTS

JP 2004-064040 2/2004
JP 2004-363154 12/2004

* cited by examiner

*Primary Examiner*—Lan Vinh
(74) *Attorney, Agent, or Firm*—Harness, Dickey & Pierce, P.L.C.

(57) ABSTRACT

A manufacturing method for a semiconductor device, includes: preparing a semiconductor wafer having an active surface, a side surface, a rear surface on the side opposite the active surface, and a plurality of semiconductor elements formed on the active surface; forming the side surface of the semiconductor wafer so that an angle defined by at least a portion of the side surface of the semiconductor wafer and the rear surface of the semiconductor wafer becomes an acute angle; and performing a spin etching in which etching liquid is dripped onto the rear surface of the semiconductor wafer while blowing air toward the active surface of the semiconductor wafer and toward the side surface of the semiconductor wafer and while rotating the semiconductor wafer.

11 Claims, 9 Drawing Sheets

MANUFACTURING METHOD FOR A SEMICONDUCTOR DEVICE

CROSS-REFERENCE TO RELATED APPLICATION

This application claims priority to Japanese Patent Application No. 2005-184652, filed on Jun. 24, 2005, the contents of which are incorporated herein by reference.

BACKGROUND

1. Technical Field

This invention relates to a manufacturing method for a semiconductor device.

2. Related Art

In recent years, compactness and light weight have been demanded of portable electronic equipment such as PDAs (Personal Data Assistants), as well as of sensors, micro-machines, printer heads, and other equipment and devices.

Because of this, greater compactness has also been required of the semiconductor devices and various other electronic components packaged within such electronic equipment.

Moreover, space for packaging such electronic components is extremely limited.

In the prior art, in order to enable packaging of semiconductor devices in limited space, by grinding the substrate of the semiconductor device, a thinner and more compact semiconductor device are obtained.

A method generally used to reduce a thickness of the silicon substrates of semiconductor devices is here explained.

First, in order to protect the silicon substrate surface, protective tape is applied to the surface of the silicon substrate.

Then, a back-grinder is used to grind a rear surface of the silicon substrate.

Next, spin etching is performed, in which an etching liquid is dripped onto the silicon substrate while rotating the silicon substrate, the damaged layer formed by grinding on the rear surface of the silicon substrate is removed.

By the above processes, the thickness of the silicon substrate is reduced.

In addition, as another method to reduce the thickness of the silicon substrate, due to improve handling during processing and due to prevent damage and similar of the silicon substrate, in recent years a method has been widely used in which the silicon substrate is supported by a supporting substrate, made of glass, SUS steel sheet, or the similar.

For example, the technology disclosed in Japanese Unexamined Patent Application, First Publication No. 2004-64040, is known.

In greater detail, first the supporting substrate is laminated onto the silicon substrate via a thermo-optical conversion layer.

Next, the rear surface (a surface on the side opposite the laminated surface) of the silicon substrate is ground.

Then, spin etching is performed to the rear surface of the silicon substrate to remove the damaged layer.

Finally, the bottom side of the supporting substrate is irradiated with laser light, and the silicon substrate is divided from the supporting substrate.

In this method, it is possible to improve handling during the processing, it is possible to prevent damage and the similar of a silicon substrate which is shaped into a thin shape.

However, in the case of using a normal spin etching apparatus, it is necessary to prevent contact of etching liquid with the rear surface (the active surface on which the semiconductor element is formed) of the surface which is etched (the processed surface).

As one countermeasure, by blowing air from below the silicon substrate, it is possible to prevent contact of the etching liquid with the active surface of the silicon substrate.

However, the above method has problems as follows.

(1) Almost all etching liquids fly out to the periphery of the silicon substrate under the action of centrifugal force during rotation of the silicon substrate during spin etching. However, there is a case in which a part of etching liquids is contacted with the active surface of the silicon substrate by flowing and contacting of the etching liquid along a side surface of the silicon substrate.

In order to prevent etching liquid from coming into contact with the active surface of the silicon substrate in this way, the removal of etching liquid at the edge portions of the silicon substrate is promoted by blowing air from below the silicon substrate.

However, the side surface of the silicon substrate is performed bevel cutting, the side surface of the silicon substrate is curved, and an angle defined by a portion of the side surface and the surface of the silicon substrate on which etching liquid is dripped, is an obtuse angle.

As a result, air is not efficiently blown, and there is the problem in that etching liquid is contact with the active surface of the silicon substrate.

Because of this, there are concerns of damage to circuit elements (semiconductor elements) formed on the active surface of the silicon substrate.

(2) Furthermore, in the method disclosed in Japanese Unexamined Patent Application, First Publication No. 2004-64040 also, similarly to the above, there is a case in which etching liquid is contact with the surface opposite the surface on which the supporting substrate and silicon substrate are laminated, so that damage is imparted to the supporting substrate.

When the desired processing to reduce the thickness of the semiconductor substrate ends, this supporting substrate is reused in the processing for thickness reduction of the next semiconductor substrate.

Hence if a damaged supporting substrate is again used in processing to reduce the thickness of a semiconductor substrate, during machining by back-grinding to reduce the thickness of the silicon substrate, there is the problem in that scattering may occur in the thickness direction of the silicon substrate.

Moreover, there is the problem in that the silicon substrate may be destroyed by processing to reduce the thickness.

For these reasons, a damaged supporting substrate cannot be reused.

Hence there is the problem of increases in the cost of manufacture of semiconductor devices.

SUMMARY

An advantage of some aspects of the invention is to provide a manufacturing method for a semiconductor device, which can prevent contact of etching liquid with the surface on the opposite side of the etched surface of the semiconductor wafer or of the supporting substrate, when spin etching is performed.

A first aspect of the invention provides a manufacturing method for a semiconductor device, including: preparing a semiconductor wafer having an active surface, a side surface, a rear surface on the side opposite the active surface, and a plurality of semiconductor elements formed on the active surface; forming the side surface of the semiconductor wafer so that an angle defined by at least a portion of the side surface of the semiconductor wafer and the rear surface of the semiconductor wafer becomes an acute angle; and performing a spin etching in which etching liquid is dripped onto the rear surface of the semiconductor wafer while blowing air toward the active surface of the semiconductor wafer and toward the side surface of the semiconductor wafer and while rotating the semiconductor wafer.

According to the manufacturing method for a semiconductor device of the first aspect of the invention, air is blown toward the active surface of the semiconductor wafer and toward the side surface of the semiconductor wafer, so that the air is blown against the entire surface on the side of the semiconductor wafer.

On the other hand, when the angle defined by the side surface of the semiconductor wafer and the rear surface of the semiconductor wafer is an obtuse angle, almost no air is blown against the side surface of the semiconductor wafer.

Hence when the angle at the side surface of the semiconductor wafer is acute, compared with a case in which the angle at the side surface of the semiconductor wafer is obtuse, an area of the side surface of the semiconductor wafer against which air is blown is increased.

By this means, etching liquid flowing and contacting along the side surface of the semiconductor wafer is caused to fly in outward directions from the semiconductor wafer by the semiconductor wafer rotation together with the air.

Hence the removal of etching liquid at the edge portion of the semiconductor wafer can be promoted.

Contact of etching liquid with the active surface of the semiconductor wafer can be prevented.

As a result, damage is no longer imparted to semiconductor elements formed on the active surface of the semiconductor wafer, and semiconductor device yields in semiconductor device manufacturing processes can be improved.

A second aspect of the invention provides a manufacturing method for a semiconductor device, including: preparing a semiconductor wafer having an active surface, a side surface, a rear surface on the side opposite the active surface, and a plurality of semiconductor elements formed on the active surface; preparing a supporting substrate supporting the semiconductor wafer and having a facing surface facing the active surface of the semiconductor wafer, a side surface, and a rear surface on the opposite side of the facing surface; connecting the semiconductor wafer and the supporting substrate via an adhesive while facing the active surface of the semiconductor wafer and the facing surface of the supporting substrate; forming the side surface of the semiconductor wafer and the side surface of the supporting substrate so that at least one among a first angle defined by at least a portion of the side surface of the semiconductor wafer and the rear surface of the semiconductor wafer, and a second angle defined by at least a portion of the side surface of the supporting substrate and the facing surface of the supporting substrate becomes an acute angle or a right angle; and performing a spin etching in which etching liquid is dripped onto the rear surface of the semiconductor wafer while blowing air toward the rear surface of the supporting substrate and toward the side surface of the supporting substrate and while rotating the semiconductor wafer.

According to the manufacturing method for a semiconductor device of the second aspect of the invention, air is blown toward the rear surface of the supporting substrate and toward the side surface of the supporting substrate, so that air is blown against the entire side surface of the supporting substrate and the entire side surface of the semiconductor wafer.

In contrast, when the first angle and the second angle are obtuse, almost no air is blown against the side surface of the semiconductor wafer or the side surface of the supporting substrate.

Hence when at least one among the first angle and the second angle is an acute angle, compared with a case in which the first angle and the second angle are obtuse angles, an area of the side surface of the semiconductor wafer and an area of the side surface of the supporting substrate against which air is blown is increased.

By this means, etching liquid flowing and contacting along the side surfaces of the semiconductor wafer and supporting substrate is caused to fly in outward directions from the semiconductor wafer by the semiconductor wafer rotation together with the air.

Hence the removal of etching liquid at the edge portion of the semiconductor wafer can be promoted.

Contact of etching liquid with the rear surface of the supporting substrate can be prevented.

Damage to the rear surface of the supporting substrate can be prevented.

Damage to the supporting substrate is prevented, so that the supporting substrate can be reused.

The cost of processing when processing to reduce the thickness of semiconductor wafers can be reduced.

It is preferable that, in the manufacturing method for a semiconductor device of the second aspect of the invention, the first angle and the second angle be defined such that the side surface of the semiconductor wafer and the side surface of the supporting substrate be positioned in the same plane.

According to the manufacturing method for a semiconductor device of the second aspect of the invention, both side surfaces of the semiconductor wafer and the supporting substrate are positioned on the same plane, so that protrusions or depressions (steps) or similar are not formed at the junction between the semiconductor wafer and the supporting substrate.

Hence etching liquid does not remain at the junction between the semiconductor wafer and the supporting substrate.

Furthermore, air is blown toward the rear surface of the supporting substrate and the side surface of the supporting substrate, so that air is blown efficiently against the entire side surface of the semiconductor wafer and the entire side surface of the supporting substrate.

A third aspect of the invention provides a manufacturing method for a semiconductor device, including: preparing a semiconductor wafer having an active surface, a side surface, a rear surface on the side opposite the active surface, and a plurality of semiconductor elements formed on the active surface; preparing a supporting substrate supporting the semiconductor wafer and having a facing surface facing the active surface of the semiconductor wafer and a side surface; connecting the semiconductor wafer and the supporting substrate via an adhesive while facing the active surface of the semiconductor wafer and the facing surface of the supporting substrate; forming, on at least one among the side surface of the semiconductor wafer and the side surface of the supporting substrate, a protruding portion having a first surface extending in the outward direction of the semiconductor wafer from a portion of the side surface of the semiconductor wafer, and a second surface extending from a portion of the side surface of the supporting substrate to the tip portion of the first surface; forming the side surface of the semiconductor wafer so that an angle defined by the first surface and the second surface of the protruding portion becomes an acute angle or a right angle; and performing a spin etching in which etching liquid is dripped onto the rear surface of the semiconductor wafer while blowing air from below the supporting substrate toward the supporting substrate and while rotating the semiconductor wafer.

According to the manufacturing method for a semiconductor device of the third aspect of the invention, a protruding portion is formed, the protruding portion has the first surface and the second surface, the angle defined by the first surface and the second surface is formed as an acute angle or a right angle, so that when air is blown from below the supporting substrate toward the supporting substrate, air is blown against the entire side surface of the supporting substrate and the entire second surface of the protruding portion.

In contrast, when the angle defined by the first surface and second surface is an obtuse angle, almost no air is blown against the second surface of the protruding portion or the side surface of the supporting substrate.

Hence when the angle defined by the first surface and the second surface is an acute angle or a right angle, compared with a case in which the angle defined by the first surface and second surface is an obtuse angle, an area of the second surface of the protruding portion against which air is blown is increased.

By this means, etching liquid flowing and contacting along the second surface of the protruding portion is caused to fly in outward directions from the semiconductor wafer by the semiconductor wafer rotation together with the air.

Hence the removal of etching liquid at the edge portion of the semiconductor wafer can be promoted.

Contact of etching liquid with the rear surface of the supporting substrate can be prevented.

Damage to the rear surface of the supporting substrate can be prevented.

Damage to the supporting substrate is prevented, and so the supporting substrate can be reused.

The cost of processing when processing to reduce the thickness of semiconductor wafers can be reduced.

It is preferable that, in the manufacturing method for a semiconductor device of the third aspect of the invention, the first surface and the rear surface of the semiconductor wafer be formed such that the first surface and the rear surface of the semiconductor wafer be positioned in the same plane.

According to the manufacturing method for a semiconductor device of the third aspect of the invention, the first surface of the protruding portion and the rear surface of the semiconductor wafer are in the same plane, so that, when back-grinding the rear surface of the semiconductor wafer in performing processing to reduce the thickness of the semiconductor wafer, the first surface of the protruding portion is simultaneously ground by the back-grinding.

Hence the protruding portion can be formed by the back-grinding of the first surface of the protruding portion efficiently and easily.

It is preferable that, in the manufacturing method for a semiconductor device of the third aspect of the invention, the material of the protruding portion include a resin.

According to the manufacturing method for a semiconductor device of the invention, the protruding portion is formed from resin, so that for example ultraviolet ray-curable resin and thermosetting resin can be used, and the protruding portion can easily be formed into a desired shape.

It is preferable that, in the manufacturing method for a semiconductor device of the third aspect of the invention, the protruding portion be formed along the outer perimeter of at least one among the side surface of the semiconductor wafer and the side surface of the supporting substrate.

According to the manufacturing method for a semiconductor device of the invention, the protruding portion is formed along the outer perimeter of the side surfaces of the semiconductor wafer and supporting substrate, so that the removal of etching liquid applied to the entire surface of the semiconductor wafer can be promoted.

A fourth aspect of the invention provides a manufacturing method for a semiconductor device, preparing a semiconductor wafer having an active surface, a side surface, a rear surface on the side opposite the active surface, and a plurality of semiconductor elements formed on the active surface; preparing a supporting substrate supporting the semiconductor wafer and having a facing surface facing the active surface of the semiconductor wafer and a side surface; arranging an adhesive on at least one among the active surface of the semiconductor wafer and the facing surface of the supporting substrate; arranging the semiconductor wafer on the lower side of the supporting substrate, and the semiconductor wafer; connecting the semiconductor wafer and the supporting substrate via the adhesive; performing a back-grinding in which the adhesive leaking from between the semiconductor wafer and the supporting substrate and the rear surface of the semiconductor wafer are ground; forming a protruding portion made of the adhesive on at least one among the side surface of the semiconductor wafer and the side surface of the supporting substrate; performing a spin etching in which etching liquid is dripped onto the rear surface of the semiconductor wafer while blowing air from below the supporting substrate toward the supporting substrate and while rotating the semiconductor wafer; and dividing the semiconductor wafer and the supporting substrate after the performing of the spin etching.

According to the manufacturing method for a semiconductor device of the invention, when the semiconductor wafer is arranged on the lower side of the supporting substrate and the semiconductor wafer is laminated onto the supporting substrate, the adhesive leaking from between the semiconductor wafer and supporting substrate, on the sides of both edges of the semiconductor wafer and supporting substrate, adheres to the side surface of the semiconductor wafer arranged on the lower side of the supporting substrate.

Hence when performing the back-grinding of the rear surface of the semiconductor wafer, the adhesive adhering to the side surface of the semiconductor wafer can be ground simultaneously.

The protruding portion, having an acute angle or a right angle that are defined by the rear surface of the semiconductor wafer and the side surface of the semiconductor wafer, can be formed on the side surface of the semiconductor wafer.

It is preferable that the manufacturing method for a semiconductor device of the fourth aspect of the invention, further include, arranging a resin on at least one among the side surface of the semiconductor wafer and the side surface of the supporting substrate after connecting the semiconductor wafer and the supporting substrate.

According to the manufacturing method for a semiconductor device of the invention, the protruding portion formed on the side surfaces of the semiconductor wafer and the supporting substrate can be formed into a desired shape, and the size of the protruding portion can also be chosen as desired.

A fifth aspect of the invention provides a manufacturing method for a semiconductor device, including: preparing a semiconductor wafer having an active surface, a side surface, a rear surface on the side opposite the active surface, and a plurality of semiconductor elements formed on the active surface; preparing a supporting substrate supporting the semiconductor wafer and having a facing surface facing the active surface of the semiconductor wafer and a side surface; forming a laminated structure by facing the active surface of the semiconductor wafer and the facing surface of the supporting substrate, and by connecting the semiconductor wafer and the supporting substrate via an adhesive; performing a back-grinding in which the rear surface of the semiconductor wafer is ground; arranging the laminated structure on a table while facing the rear surface of the semiconductor wafer to the table; forming a protruding portion by arranging a resin on at least one among the side surface of the semiconductor wafer and the side surface of the supporting substrate; dividing the laminated structure from the table; performing a spin etching in which etching liquid is dripped onto the rear surface of the semiconductor wafer while blowing air from below the supporting substrate toward the supporting substrate and while rotating the semiconductor wafer; and dividing the semiconductor wafer and the supporting substrate after the performing of the spin etching.

According to the manufacturing method for a semiconductor device of the invention, resin can be arranged along the side surface of the laminated structure made of the semiconductor wafer and supporting substrate, arranged on a table.

When the laminated structure is divided from the table, the protruding portion having prescribed shape can be formed on the side surface of the laminated structure.

It is preferable that, in the manufacturing method for a semiconductor device of the fifth aspect of the invention, an angle defined by a surface of the table on which the laminated structure be arranged and a side surface of the protruding portion, be an acute angle or a right angle.

According to the manufacturing method for a semiconductor device of the invention, the protruding portion can be formed on the side surfaces of the semiconductor wafer and supporting substrate, such that the angle defined by the surface of the table on which the semiconductor wafer is arranged and by the side surface of the adhesive (protruding portion) is an acute angle or a right angle.

DESCRIPTION OF EXEMPLARY EMBODIMENTS

Figure 1A:
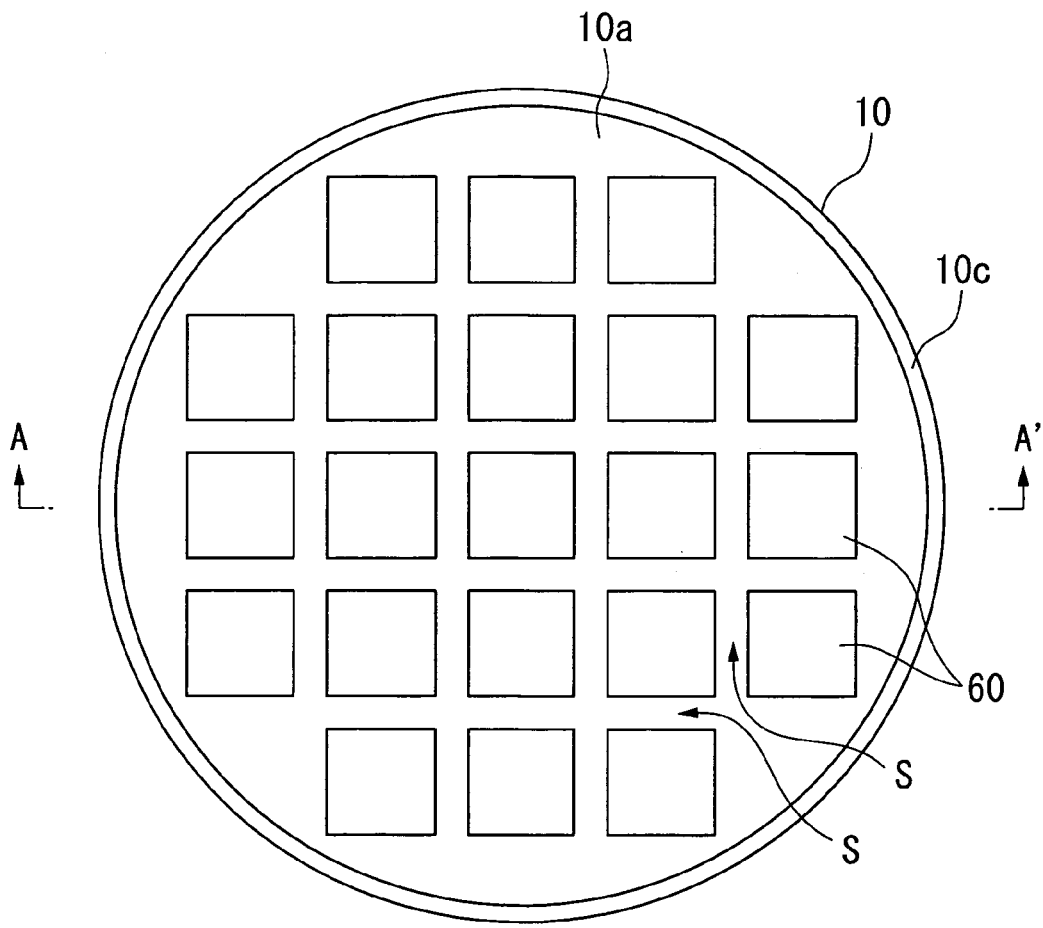
FIG. 1A is a plan view that schematically shows the semiconductor wafer of a first embodiment.

Below, embodiments of the invention are explained, referring to the drawings.

In each of the drawings used in the explanations which follow, the scale of the various members is modified appropriately to sizes enabling recognition of the members.

First Embodiment

Below, a first embodiment of the invention is explained, referring to the drawings.

Semiconductor Wafer

FIG. 1A is a plan view that schematically shows a semiconductor wafer 10 on which are formed semiconductor regions 60.

Figure 1B:
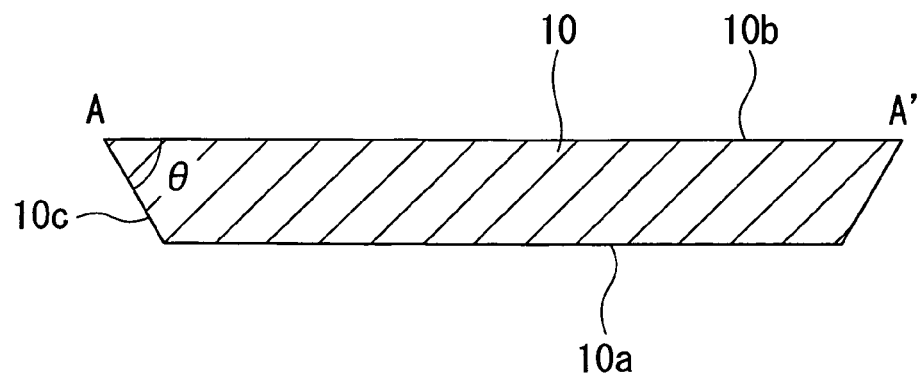
FIG. 1B is a cross-sectional view of the semiconductor wafer taken along the line A-A' shown in FIG. 1A.

FIG. 1B is a cross-sectional view of the semiconductor wafer taken along the line A-A' shown in FIG. 1A.

Figure 1C:
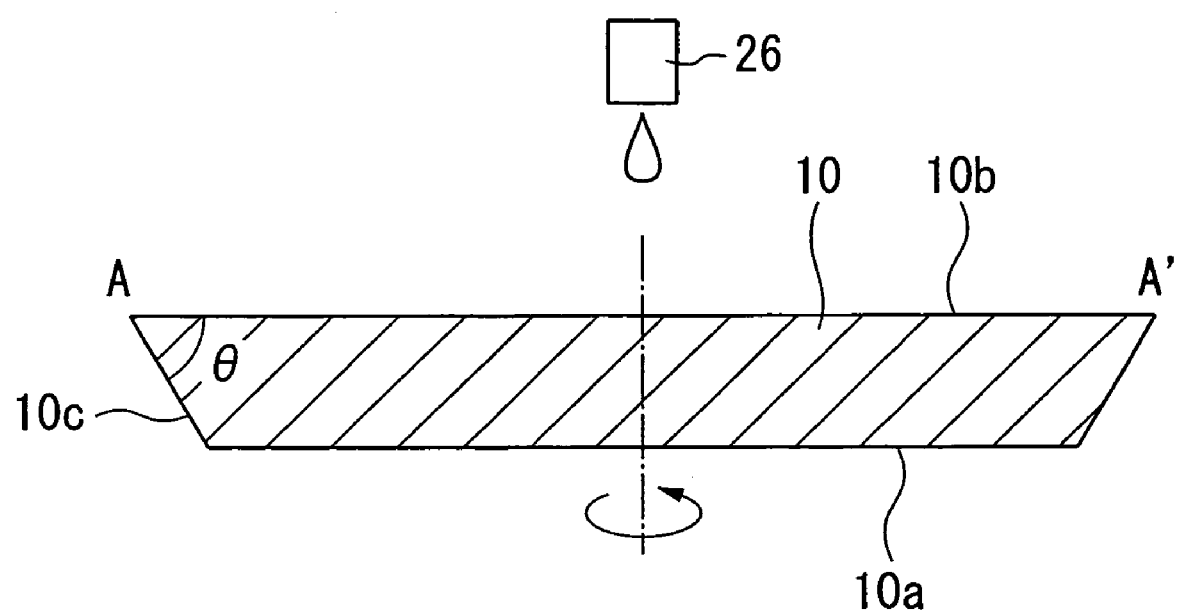
FIG. 1C is a cross-sectional view of the semiconductor wafer taken along the line A-A' shown in FIG. 1A and is a view that explains the process of spin etching to the rear surface of the semiconductor wafer.

FIG. 1C is a cross-sectional view of the semiconductor wafer taken along the line A-A' shown in FIG. 1A and is a view that explains the process of spin etching to the rear surface of the semiconductor wafer.

The material of the semiconductor wafer shown in FIG. 1A is silicon.

A plurality of semiconductor regions 60 are formed on the semiconductor wafer 10.

Here, semiconductor regions 60 are areas, each of which is to become semiconductor device by dividing the semiconductor wafer 10 into individual semiconductor region 60.

On the active surface 10a of the semiconductor wafer 10, integrated circuits, containing transistors, memory elements, and other semiconductor elements are formed in each of the semiconductor regions 60.

On the other hand, the rear surface 10b on the side of the semiconductor wafer 10 opposite the active surface 10a is the surface for back-grinding.

Semiconductor elements are not formed on the rear surface 10b of the semiconductor wafer 10.

As shown in FIG. 1A, the intervals between adjacent semiconductor regions 60 are dicing regions S.

In these dicing regions S, the semiconductor wafer 10 is cut or diced and so divided into the individual semiconductor regions 60.

As the types of wafers on which the semiconductor elements are formed, in addition to silicon, liquid crystal device wafers of GAs, sapphire, glass, and similar, which can be processed to reduce thickness, can be used.

As shown in FIG. 1B, the semiconductor wafer 10 is formed such that the angle θ defined by the side surface 10c of the semiconductor wafer 10 and the rear surface 10b of the semiconductor wafer 10 is an acute angle.

That is, the side surface 10c of the semiconductor wafer 10 forms a knife-edge along the circular perimeter of the semiconductor wafer 10.

This shape of the side surface 10c of the semiconductor wafer 10 is formed by for example machining, etching, or other means.

The side surface 10c of the semiconductor wafer 10 may also be formed with a rounded shape so as to be depressed in the inward direction of the semiconductor wafer 10.

Furthermore, a protruding portion may be formed on a portion of the side surface 10c of the semiconductor wafer 10.

In this case, the angle defined by the upper surface of the protruding portion and the side surface of the protruding portion may be an acute angle with respect to the rear surface 10b of the semiconductor wafer 10.

Next, a process of the spin etching to the rear surface 10b of the semiconductor wafer 10 is explained, referring to FIG. 1C.

In the spin etching process, etching liquid is dripped onto the rear surface 10b of the semiconductor wafer 10 while rotating the semiconductor wafer 10.

Here, etching liquid is dripped onto the rear surface 10b of the semiconductor wafer 10 from a nozzle 26 arranged above the semiconductor wafer 10.

The etching liquid dripped onto the rear surface 10b spreads toward the outer perimeter of the semiconductor wafer 10 due to the centrifugal force resulting from rotation of the semiconductor wafer 10.

On the rear surface 10b, etching liquid which has wetted and spread to the edge of the semiconductor wafer 10 flies in the outward direction of the semiconductor wafer 10.

In this spin etching process, air is blown from below the semiconductor wafer 10 toward the semiconductor wafer 10.

The air blown toward the semiconductor wafer 10 is blown against the active surface 10a and side surface 10c.

Here, the angle $\theta$ defined by the side surface 10c of the semiconductor wafer 10 and the rear surface 10b of the semiconductor wafer 10 is an acute angle, and so air blown against the side surface 10c flows in the direction along the side surface 10c.

Hence air blown from the side below the active surface 10a of the semiconductor wafer 10 toward the semiconductor wafer 10 is blown against the entire side surface 10c of the semiconductor wafer 10.

According to this embodiment, etching liquid which flows and contacts along the side surface 10c of the semiconductor wafer 10 toward the active surface 10a of the semiconductor wafer 10 can be caused to fly in the outward direction of the semiconductor wafer 10 by the blown air, together with rotation of the semiconductor wafer 10.

Etching liquid can be prevented from flowing and contacting along the side surface 10c of the semiconductor wafer 10 and can be prevented from contact with the active surface 10a of the semiconductor wafer 10.

Hence the flying-outward of etching liquid at the edge of the semiconductor wafer 10 is promoted, and contact of etching liquid with the active surface 10a of the semiconductor wafer 10 can be prevented.

After the end of the process of spin etching to the semiconductor wafer 10, a dicing-blade is used to cut the semiconductor wafer in the dicing regions S shown in FIG. 1A, to divide the semiconductor wafer 10 into each of the semiconductor regions 60, to obtain the individual semiconductor devices.

As a result, it is possible to suppress damage by the etching liquid to the semiconductor elements in the semiconductor regions 60 formed on the active surface 10a of the semiconductor wafer 10, and so yields of semiconductor devices in semiconductor device manufacturing processes can be improved.

Second Embodiment

Below, a second embodiment of the invention is explained, referring to the drawings.

Laminated Structure of Semiconductor Wafer and Glass Substrate

First, a structure in which the semiconductor wafer 10 and a glass substrate 20 supporting the semiconductor wafer 10 are laminated is explained.

Figure 2A:
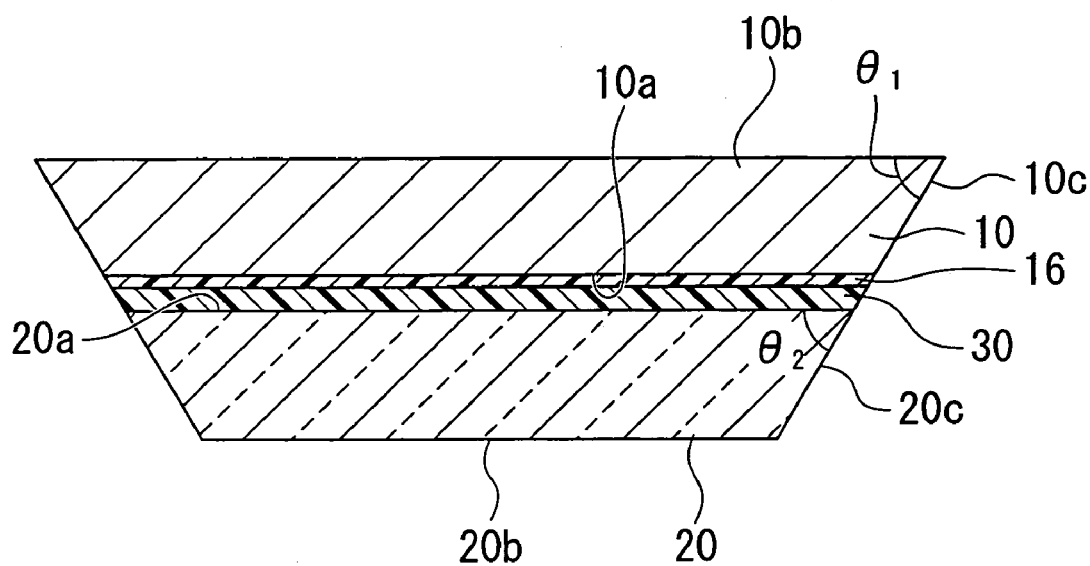
FIG. 2A is a cross-sectional view that schematically shows the semiconductor wafer of a second embodiment.

FIG. 2A is a cross-sectional view that schematically shows the laminated structure of the semiconductor wafer 10 and the glass substrate 20.

Figure 2B:
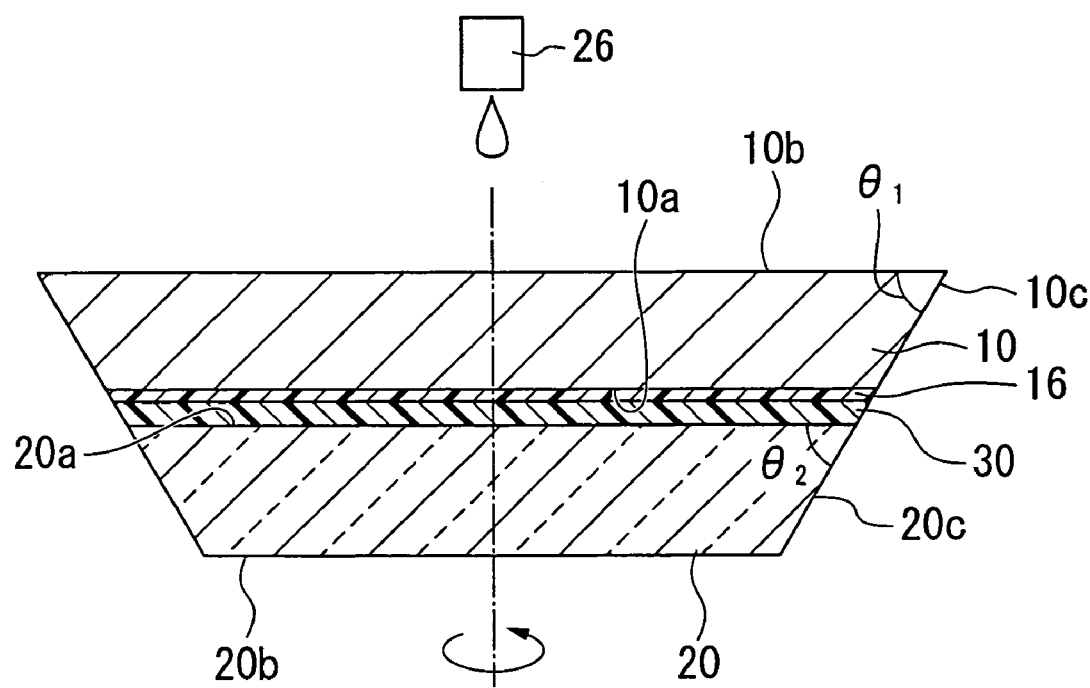
FIG. 2B is a cross-sectional view that schematically shows the semiconductor wafer of a second embodiment and is a view that explains the process of spin etching to the rear surface of a semiconductor wafer.

FIG. 2B is a cross-sectional view that schematically shows the laminated structure of the semiconductor wafer 10 and the glass substrate 20, and is a view that explains the process of spin etching to the rear surface of the semiconductor wafer.

Because of the structure of the semiconductor wafer 10 is the same as the above-described semiconductor wafer, an explanation is omitted.

In this embodiment, the angle defined by the rear surface 10b of the semiconductor wafer 10 and the side surface 10c of the semiconductor wafer 10 is called $\theta 1$, and the angle defined by the adhesion surface 20a (facing surface) of the glass substrate 20 and the side surface 20c of the glass substrate 20 is called $\theta 2$.

Here, the adhesion surface 20a is the surface at which the semiconductor wafer 10 and the glass substrate 20 are bonded together, via an adhesion layer 30 (adhesive) and a separation layer 16 intervening.

As shown in FIG. 2A, the semiconductor wafer 10 is laminated onto the glass substrate 20 (supporting substrate), via the adhesion layer 30 and separation layer 16 intervening.

Here, a surface of the glass substrate 20 in contact with the adhesion layer 30 is called the adhesion surface 20a.

The glass substrate 20 supports the semiconductor wafer 10 during processing to reduce the thickness of the semiconductor wafer 10.

The glass substrate 20 suppresses flexion of the semiconductor wafer 10, improves handling during processing to reduce the thickness of the semiconductor wafer 10, and prevents breakage of the semiconductor wafer 10 and similar.

The material of the glass substrate 20 is a transparent material.

Because of the glass substrate 20 is formed from a transparent material, by irradiating the separation layer 16 with laser light, the semiconductor wafer 10 can be divided from the glass substrate 20.

Furthermore, the glass substrate 20 is formed such that the angle $\theta 2$ defined by the side surface 20c of the glass substrate 20 and the adhesion surface 20a (facing surface) of the glass substrate 20 is an acute angle.

That is, similarly to the semiconductor wafer 10, the side surface 20c of the glass substrate 20 is formed into a knife-edge shape along the circular perimeter of the glass substrate 20.

The angle $\theta 2$ defined by the adhesion surface 20a of the glass substrate 20 and the side surface 20c of the glass substrate 20 may also be substantially 90°.

The angle $\theta 1$ defined by the rear surface 10b of the semiconductor wafer 10 and the side surface 10c of the semiconductor wafer 10 may also be substantially 90°.

As the supporting substrate which supports the semiconductor wafer 10, an acrylic plate or similar may be used.

In order to improve the adhesive properties of the separation layer 16, the surface of the glass substrate 20 may be surface-treated using a silane coupling agent or similar.

When using a UV-curable type separation layer 16, the material of the glass substrate 20 may be a material which transmits ultraviolet rays.

The separation layer 16 is used when separating the laminated semiconductor wafer 10 and the glass substrate 20, after the processing to reduce the thickness of the semiconductor wafer 10.

That is, by irradiating the separation layer 16 with laser light, the separation layer 16 itself is separated, and so the semiconductor wafer 10 and the glass substrate 20, which had been laminated via the separation layer 16 intervening, are divided.

As the material of the separation layer 16, a light-absorbing agent or a thermal-decomposition resin is used.

As a light-absorbing agent, carbon black, fine metal powder of iron or similar, or a dye or pigment is used.

As a thermal-decomposition resin, gelatin, cellulose, or another material is used.

The adhesion layer 30 is used to fix the semiconductor wafer 10 to the glass substrate 20, via the separation layer 16 intervening.

As explained below, after separating the semiconductor wafer 10 and the glass substrate 20, the adhesion layer 30 adheres to the semiconductor wafer 10.

Hence as the material of the adhesion layer 30, an ultraviolet-curable type resin, such as for example an epoxy resin, which can easily be separated from the semiconductor wafer 10, is used.

This epoxy resin is a material having durability with respect to the etching liquid used when performing the spin etching.

As the material of the adhesion layer 30, in addition to an epoxy resin, dual-backed tape, rubber adhesive, an epoxy, urethane, or other-based single-liquid thermosetting adhesive, an epoxy, urethane, acrylic or other-based two-liquid adhesive which reacts upon mixing, a hot-melt type adhesive, an acrylic, epoxy or other-based ultraviolet (UV) or electron beam-curable adhesive, a water-dispersed adhesive, or other adhesive which is resistant to the etching liquid, may be used.

In this embodiment, the angle $\theta 1$ which is defined by the side surface 10c of the semiconductor wafer 10 and the rear surface 10b of the semiconductor wafer 10, and the angle $\theta 2$ defined by the side surface 20c of the glass substrate 20 and the adhesion surface 20a of the glass substrate 20, are both formed as acute angles, and the angle $\theta 1$ and angle $\theta 2$ are substantially the same angle.

Furthermore, the side surface 10c of the semiconductor wafer 10 and the side surface 20c of the glass substrate 20 are positioned on the same plane.

Here, the positioning on the same plane of the side surface 10c and the side surface 20c means that the extended plane resulting by extending the side surface 10c of the semiconductor wafer 10 and the side surface 20c of the glass substrate 20 are positioned on the same plane.

The thicknesses of the separation layer 16 and the adhesion layer 30 are small compared with the thicknesses of the semiconductor wafer 10 and the glass substrate 20.

Consequently, the thicknesses of the separation layer 16 and the adhesion layer 30 are sufficiently small that they can be ignored.

Next, the process of the spin etching to the rear surface 10b of the semiconductor wafer 10 is explained, referring to FIG. 2B.

In the spin etching process, etching liquid is dripped onto the rear surface 10b of the semiconductor wafer 10 with the semiconductor wafer 10 laminated onto the glass substrate 20, while rotating the semiconductor wafer 10.

Here, etching liquid is dripped onto the rear surface 10b of the semiconductor wafer 10 from a nozzle 26 arranged above the semiconductor wafer 10.

The etching liquid dripped onto the rear surface 10b spreads toward the outer perimeter of the semiconductor wafer 10 due to the centrifugal force resulting from rotation of the semiconductor wafer 10.

On the rear surface 10b, etching liquid which has wetted and spread to the edge of the semiconductor wafer 10 flies in the outward direction of the semiconductor wafer 10.

In this spin etching process, air is blown from below the glass substrate 20 toward the glass substrate 20.

Air blown toward the glass substrate 20 is blown against the rear surface 20b on the side opposite the adhesion surface 20a of the glass substrate 20, the side surface 20c of the glass substrate 20, and the side surface 10c of the semiconductor wafer 10.

Here, the angle $\theta 1$ defined by the side surface 10c of the semiconductor wafer 10 and the rear surface 10b of the semiconductor wafer 10, and the angle $\theta 2$ defined by the side surface 20c of the glass substrate 20 and the adhesion surface 20a of the glass substrate 20, are both acute angles, and so the air blown against the side surface 20c and side surface 10c flows in the direction along the side surface 20c and side surface 10c.

Hence air blown from below the glass substrate 20 toward the glass substrate 20 is blown against the entire side surface 20c of the glass substrate 20 and against the entire side surface 10c of the semiconductor wafer 10.

As a result, the areas of the side surface 10c of the semiconductor wafer 10 and the side surface 20c of the glass substrate 20 against which air is blown are increased.

According to this embodiment, etching liquid which flows and contacts along the side surface 10c of the semiconductor wafer 10 and the side surface 20c of the glass substrate 20 can be caused to fly in the outward direction of the semiconductor wafer 10 by the blown air, together with rotation of the semiconductor wafer 10.

By this means, the removal of etching liquid at the edges of the semiconductor wafer 10 is promoted, and so contact of the etching liquid with the rear surface 20b of the glass substrate 20 can be avoided.

Hence damage to the rear surface 20b of the glass substrate 20 by the etching liquid can be prevented.

By preventing damage to the glass substrate 20, it is possible to reuse of the glass substrate 20, so that costs incurred in processing to reduce the thickness of the semiconductor wafer 10 can be reduced.

According to this embodiment, a junction surface is formed between the side surface 10c of the semiconductor wafer 10 and the side surface 20c of the glass substrate 20, so that protrusions or depressions (steps) or similar are not formed at the junction between the semiconductor wafer 10 and the glass substrate 20.

Hence etching liquid does not remain at the junction between the semiconductor wafer 10 and the glass substrate 20.

Furthermore, by blowing air from below the glass substrate 20 against the glass substrate 20, air can be efficiently blown against the entire side surface 10c of the semiconductor wafer 10 and against the entire side surface 20c of the glass substrate 20.

After completion of the process of spin etching of the semiconductor wafer 10, the semiconductor wafer 10 and the glass substrate 20 are divided.

Then, a dicing-blade is used to cut the semiconductor wafer in the dicing regions S shown in FIG. 1A, to divide the semiconductor wafer 10 into each of the semiconductor regions 60, to obtain the individual semiconductor devices.

As a result, it is possible to suppress damage by the etching liquid to the semiconductor elements in the semiconductor regions 60 formed on the active surface 10a of the semiconductor wafer 10, and so yields of semiconductor devices in semiconductor device manufacturing processes can be improved.

Third Embodiment

Below, a third embodiment of the invention is explained, referring to the drawings.

In this embodiment, the process of spin etching to the rear surface 10b of the semiconductor wafer 10 is similar to that of the above-described second embodiment, and so an explanation of the spin etching process is omitted.

Laminated Structure of Semiconductor Wafer and the Glass Substrate

Figure 3:
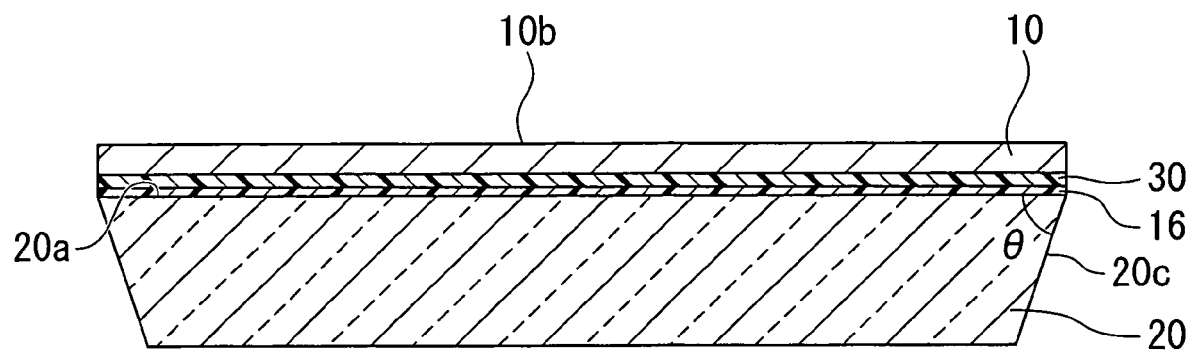
FIG. 3 is a cross-sectional view that schematically shows the semiconductor wafer of a third embodiment.

FIG. 3 is a cross-sectional view that schematically shows the laminated structure of the semiconductor wafer 10 and the glass substrate 20 supporting the semiconductor wafer 10.

As shown in FIG. 3, the semiconductor wafer 10 and the glass substrate 20 are laminated via the adhesion layer 30 intervening.

Here, the rear surface 10b of the semiconductor wafer 10 is ground by the back-grinding, in processing to reduce the thickness of the semiconductor wafer 10.

This embodiment differs from the above embodiments in that the side surface 10c of the semiconductor wafer 10 is not performed machining, etching, or other means. The angle defined by the rear surface 10b of the semiconductor wafer 10 and the side surface 10c of the semiconductor wafer 10 is substantially 90°.

On the other hand, the glass substrate 20 is formed such that the angle θ defined by the side surface 20c of the glass substrate 20 and the contact surface 20a of the glass substrate 20 is an acute angle.

That is, the side surface 20c of the glass substrate 20 is formed into a knife-edge shape along the circular perimeter of the glass substrate 20. The angle θ defined by the side surface 20c of the glass substrate 20 and the contact surface 20a of the glass substrate 20 may also be substantially 90°.

In this embodiment also, action similar to that in the above-described first embodiment and the above-described second embodiment occurs, and similar advantageous results are obtained.

Fourth Embodiment

Below, a fourth embodiment of the invention is explained, referring to the drawings.

In this embodiment, the process of the spin etching to the rear surface 10b of the semiconductor wafer 10 is similar to that of the above-described second embodiment, and so an explanation of the spin etching process is omitted.

Laminated Structure of Semiconductor Wafer and Glass Substrate

Figure 4:
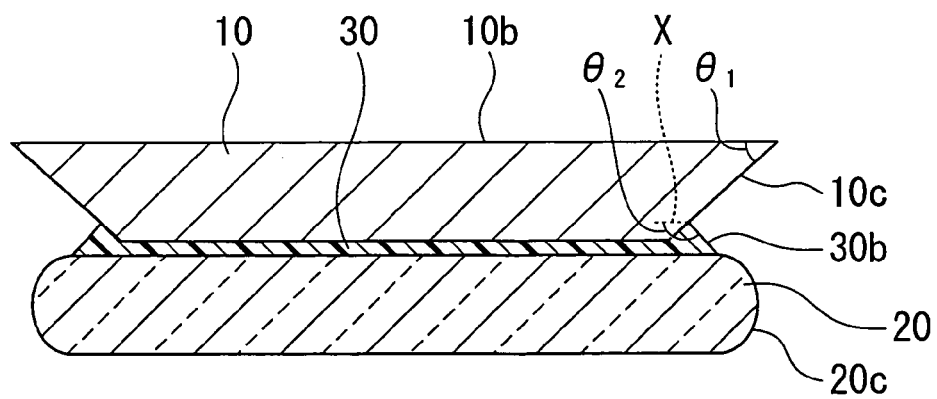
FIG. 4 is a cross-sectional view that schematically shows the semiconductor wafer of a fourth embodiment.

FIG. 4 is a cross-sectional view that schematically shows the laminated structure of the semiconductor wafer 10 and the glass substrate 20 supporting the semiconductor wafer 10.

As shown in FIG. 4, the semiconductor wafer 10 and the glass substrate 20 are laminated, via the adhesion layer 30 intervening.

The angle θ1 defined by the rear surface 10b of the semiconductor wafer 10 and the side surface 10c of the semiconductor wafer 10 is an acute angle with respect to the rear surface 10b of the semiconductor wafer 10.

The glass substrate 20 is cut to be substantially the same size and shape as the semiconductor wafer 10 by performing the bevel-cutting, and the side surface 20c of the glass substrate 20 is curved in an arc shape.

When forming such a laminated structure of the semiconductor wafer 10 and the glass substrate 20, upon laminating the semiconductor wafer 10 and the glass substrate 20 via the adhesion layer 30 intervening, there are cases in which the adhesion layer 30 leaks outward onto the side surface 10c of the semiconductor wafer 10, as shown in FIG. 4.

Here, because of the side surface 10c of the semiconductor wafer 10 is formed into an acute angle, the angle θ2 formed by the side surface 30b of the adhesion layer 30 which has leaked out and the side surface 10b of the semiconductor wafer 10 is an obtuse angle.

Consequently, if the rear surface 10b of the semiconductor wafer 10 is ground too much, the position of the rear surface 10b reaches the position of the processing target plane X in FIG. 4, and the acute-angle portion of the side surface 10c of the semiconductor wafer is covered by the resin layer 30.

If the side surface 10c of the semiconductor wafer 10, the thickness of which has been reduced, is thus covered by the resin layer 30, a surface (the side surface 30b) is formed which makes an obtuse angle with the rear surface 10b of the semiconductor wafer 10.

Hence when an adhesion layer 30 is arranged on at least one among the semiconductor wafer 10 and the glass substrate 20, the amount of resin is adjusted such that the position of the tip of the adhesion layer 30 which has leaked out onto the side surface 10c of the semiconductor wafer 10 is lower than the position of the processing target plane X (indicated by the dashed line in the FIG. 4) of the semiconductor wafer 10 shown in FIG. 4.

Alternatively, when grinding the rear surface 10b of the semiconductor wafer 10, the back-grinding can be controlled to grind the rear surface 10b such that the position of the rear surface 10b does not fall below the processing target plane X.

According to this embodiment also, action similar to that in the above-described first embodiment and the above-described second embodiment occurs, and similar advantageous results are obtained.

Fifth Embodiment

Below, a fifth embodiment of the invention is explained, referring to the drawings.

Laminated Structure of Semiconductor Wafer and Glass Substrate

First, the structure in which the semiconductor wafer 10 and the glass substrate 20 supporting the semiconductor wafer 10 are laminated is explained.

Figure 5A:
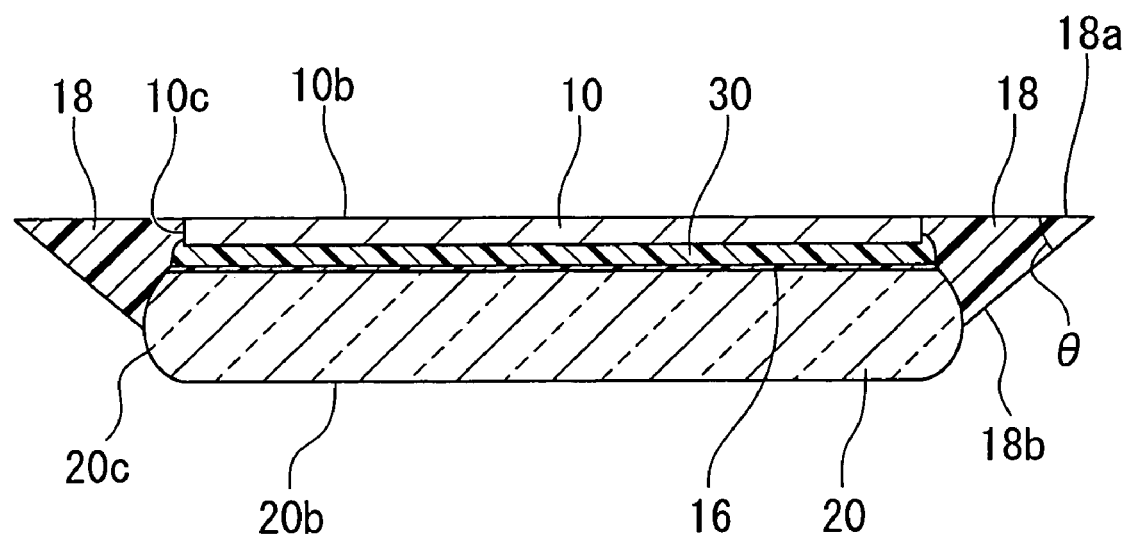
FIG. 5A is a cross-sectional view that schematically shows the semiconductor wafer of a fifth embodiment.

FIG. 5A is a cross-sectional view that schematically shows the laminated structure of the semiconductor wafer 10 and the glass substrate 20 supporting the semiconductor wafer 10.

Figure 5B:
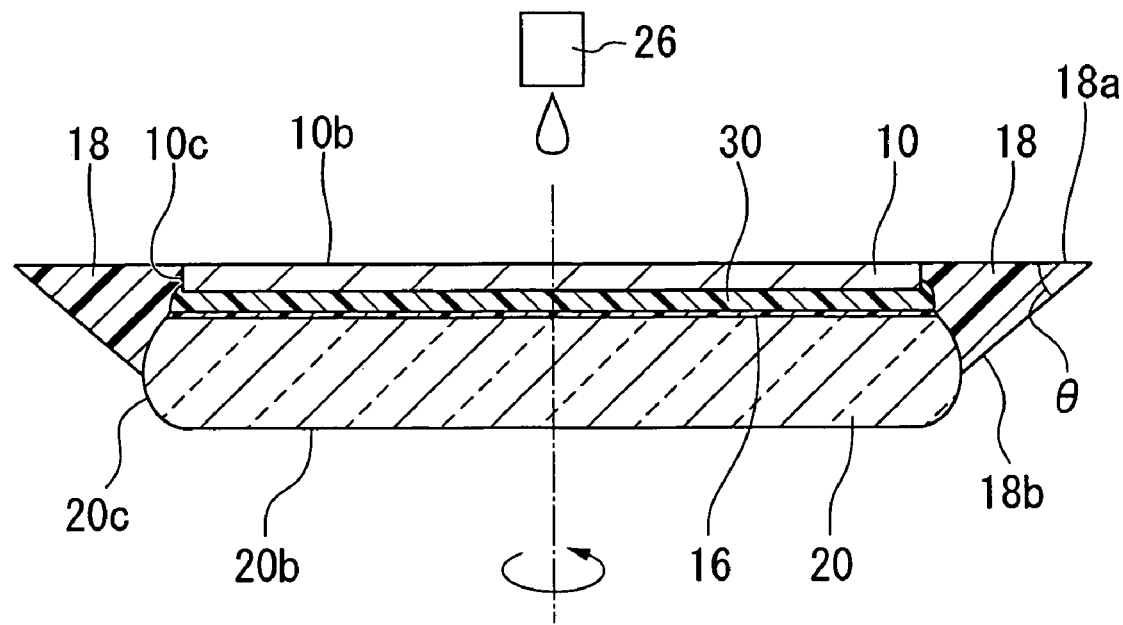
FIG. 5B is a cross-sectional view that schematically shows the semiconductor wafer of a fifth embodiment and is a view that explains the process of spin etching to the rear surface of a semiconductor wafer.

FIG. 5B is a cross-sectional view that schematically shows the laminated structure of the semiconductor wafer 10 and the glass substrate 20, and is a view that explains the process of spin etching to the rear surface of the semiconductor wafer.

As shown in FIG. 5A, the semiconductor wafer 10 and the glass substrate 20 are laminated via the adhesion layer 30 intervening.

Here, the rear surface 10b of the semiconductor wafer 10 is ground by the back-grinding, in processing to reduce the thickness of the semiconductor wafer 10.

Because of the semiconductor wafer 10 has a structure similar to those of semiconductor wafers described above, an explanation is omitted.

Furthermore, a protruding portion 18 is formed on the side surface 10c of the semiconductor wafer 10 and the side surface 20c of the glass substrate 20.

The glass substrate 20 is cut to be substantially the same size and shape as the semiconductor wafer 10 by performing the bevel-cutting, and the side surface 20c of the glass substrate 20 is curved in an arc shape.

The protruding portion 18 is made of the same resin material as the adhesion layer 30 (adhesive).

The protruding portion 18 has a first surface 18a and a second surface 18b (side surface).

The first surface 18a is formed on the same plane as the rear surface 10b (polished surface), and extends in the outward direction from the semiconductor wafer 10.

The second surface 18b extends from a portion of the side surface 20c of the glass substrate 20 to a tip of the first surface 18a extending in the outward direction of the semiconductor wafer 10.

The angle θ defined by the first surface 18a of the protruding portion 18 and the second surface 18b of the protruding portion 18 is an acute angle.

The first surface 18a of the protruding portion 18 and the rear surface 10b of the semiconductor wafer 10 are formed so as to be positioned on the same plane.

The first surface 18a of the protruding portion 18 is formed simultaneously when the rear surface 10b of the semiconductor wafer 10 is formed by performing the back-grinding.

Hence the back-grinding of the first surface 18a of the protruding portion 18 can be performed efficiently and easily, to form the protruding portion 18. The above angle θ may be substantially 90° as well.

The material of the adhesion layer 30 and the material of the separation layer 16 are similar to those in the second embodiment.

Next, the process of spin etching to the rear surface 10b of the semiconductor wafer 10 is explained, referring to FIG. 5B.

In the spin etching process, with the semiconductor wafer 10 and the glass substrate 20 laminated, etching liquid is dripped onto the rear surface 10b of the semiconductor wafer 10 while rotating the semiconductor wafer 10.

Here, etching liquid is dripped onto the rear surface 10b of the semiconductor wafer 10 from a nozzle 26 arranged above the semiconductor wafer 10.

The etching liquid dripped onto the rear surface 10b spreads toward the outer perimeter of the semiconductor wafer 10 due to the centrifugal force resulting from rotation of the semiconductor wafer 10.

On the rear surface 10b, etching liquid which has wetted and spread to the edge of the semiconductor wafer 10 wets and spreads over the first surface 18a of the protruding portion 18, and flies outward from the tip of the first surface 18a in the outward direction of the protruding portion 18.

In such a spin etching process, air is blown from below the glass substrate 20 toward the glass substrate 20.

The air blown toward the glass substrate 20 is blown against the rear surface 20b on the side opposite the adhesion surface 20a of the glass substrate 20, the side surface 20c of the glass substrate 20, and the second surface 18b of the protruding portion 18.

Air blown against the second surface 18b of the protruding portion 18 flows in the direction along the second surface 18b of the protruding portion 18.

Hence air blown from below the glass substrate 20 toward the glass substrate 20 is blown against the entire side surface 20c of the glass substrate 20 and against the entire second surface 18b of the protruding portion 18.

As a result, the areas of the second surface 18b of the glass substrate 20 and of the side surface 20c of the glass substrate 20 against which air is blown are increased.

According to this embodiment, etching liquid which flows and contacts along the second surface 18b of the protruding portion 18 and the side surface 20c of the glass substrate 20 can be caused to fly in the outward direction of the semiconductor wafer 10 by the blown air, together with rotation of the semiconductor wafer 10.

By this means, removal of etching liquid at the tip of the first surface 18a of the protruding portion 18 is promoted, and contact of the etching liquid with the rear surface 20b of the glass substrate 20 can be avoided.

That is, by forming a protruding portion 18 on the side surface 10c of the semiconductor wafer 10 and the side surface 20c of the glass substrate 20, the removal of etching liquid at the end of the semiconductor wafer 10 can be promoted, and contact of the etching liquid with the rear surface 20b of the glass substrate 20 can be prevented.

Hence damage to the rear surface 20b of the glass substrate 20 by the etching liquid can be prevented.

Furthermore, by preventing damage to the glass substrate 20, the glass substrate 20 can be reused, and so the costs incurred in the processing to reduce the thickness of the semiconductor wafer 10 can be lowered.

Moreover, by blowing air from below the glass substrate 20 onto the glass substrate 20, air can be blown efficiently against the entire second surface 18b of the protruding portion 18 and against the entire side surface 20c of the glass substrate 20.

After completion of the process of spin etching of the semiconductor wafer 10, the semiconductor wafer 10 and the glass substrate 20 are divided. Also, the protruding portion 18 is removed.

Thereafter, a dicing-blade is used to cut the semiconductor wafer in the dicing regions S shown in FIG. 1A, to divide the semiconductor wafer 10 into each of the semiconductor regions 60, to obtain the individual semiconductor devices.

As a result, it is possible to suppress damage by the etching liquid to the semiconductor elements in the semiconductor regions 60 formed on the active surface 10a of the semiconductor wafer 10, and so yields of semiconductor devices in semiconductor device manufacturing processes can be improved.

Sixth Embodiment

Below, a sixth embodiment of the invention is explained, referring to the drawings.

In this embodiment, components which are the same as the components in the above-described first through fifth embodiments are assigned the same reference symbols, and explanations are omitted.

In this embodiment, the method of forming of the protruding portion 18 is described in detail, and the process for rendering the semiconductor wafer 10 into a thin film is explained.

FIGS. 6A to 7D are cross-sectional views that show processes in the manufacturing of semiconductor devices of this embodiment.

In FIGS. 6A to 7D, the semiconductor wafer 10 is shown schematically.

Manufacturing Method for Semiconductor Device

Figure 6A:
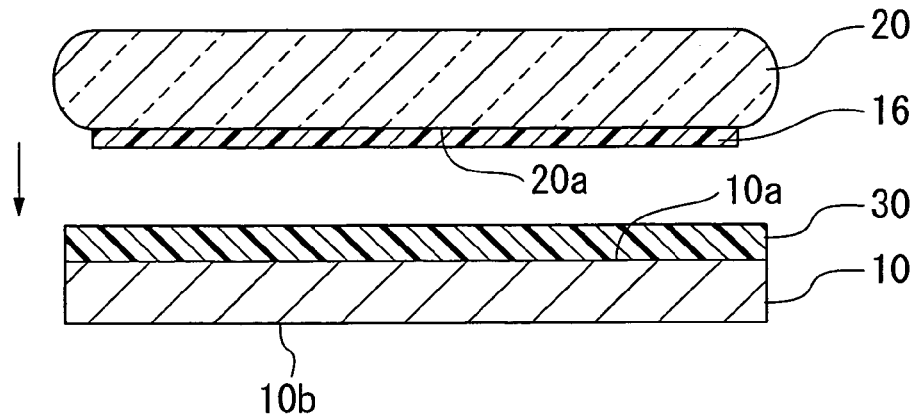
FIGS. 6A to 6C are cross-sectional views that show manufacturing processes for the semiconductor device, in the manufacturing method for the semiconductor device of a sixth embodiment.

First, the separation layer 16 is formed on the adhesion surface 20a of the glass substrate 20, as shown in FIG. 6A.

Then, spin-coating method is used to form an ultraviolet-curable type adhesion layer 30 (resin) on the active surface 10a of the semiconductor wafer 10.

In the process of the forming of the adhesion layer 30, when laminating the glass substrate 20 and the semiconductor wafer 10, resin is applied to the semiconductor wafer 10 with the resin amount adjusted such that resin leaks outward from the edge portions of the glass substrate 20 and the semiconductor wafer 10.

Next, as shown in FIG. 6A, the semiconductor wafer 10 and the glass substrate 20 are transported into a vacuum chamber, and are arranged on a support stand, with the semiconductor wafer 10 on the lower side and the glass substrate 20 on the upper side.

A vacuum clamp portion is arranged on the support stand.

The vacuum clamp portion corrects the flexion of the semiconductor wafer 10 by clamping the semiconductor wafer 10 to the support stand.

Figure 6B:
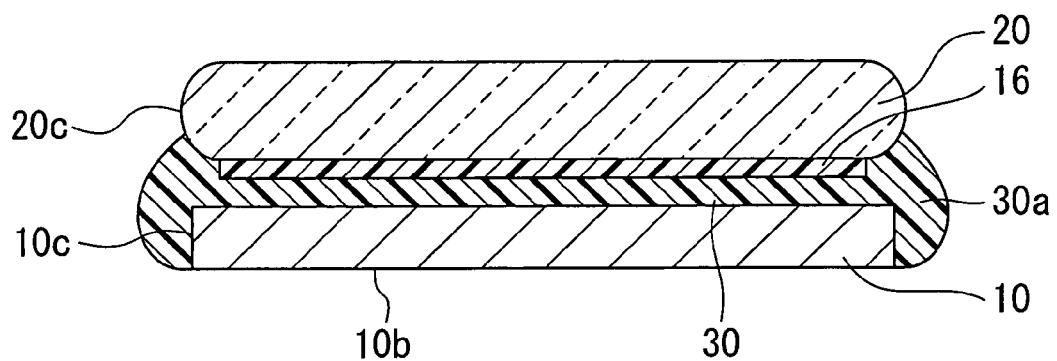

Next, as shown in FIG. 6B, with the vacuum chamber interior in a reduced-pressure state, the adhesion surface 20a of the glass substrate 20 and the active surface 10a of the semiconductor wafer 10 are faced together, and the separation layer 16 formed on the glass substrate 20 is brought into contact with the adhesion layer 30 formed on the semiconductor wafer 10, to laminate the two.

Next, the adhesion layer 30 is irradiated with ultraviolet rays, to cure the resin of the adhesion layer 30.

Through the laminating in a vacuum environment, the inclusion of air bubbles in the adhesion layer 30 can be prevented.

At this time, as shown in FIG. 6B, an amount of resin in excess of the resin amount necessary for bonding with the glass substrate 20 is applied in advance to the semiconductor wafer 10.

Consequently, resin 30a leaks outward from between the semiconductor wafer 10 and the glass substrate 20.

The resin 30a which has leaked out adheres along the outer perimeter to the side surface 10c of the semiconductor wafer 10, arranged on the lower side.

When the amount of resin applied is further increased during resin application, resin adheres to a portion of the side surface 20c of the glass substrate 20 arranged on the upper side.

In this embodiment, during the process preceding back-grinding of the rear surface 10b of the semiconductor wafer 10, resin is caused to adhere to the side surface 10c of the semiconductor wafer 10.

Hence, in the process of the laminating of the glass substrate 20 and the semiconductor wafer 10, when a small amount of resin leaks outward, and there is an insufficient amount to form the resin 30a, after the laminating of the semiconductor wafer 10 and the glass substrate 20, a separate process may be performed of causing additional resin to adhere to the side surface 10c of the semiconductor wafer 10, to increase the amount of resin 30a.

When there is a need to shape the leaked-out resin 30a into a prescribed shape, after the laminating of the semiconductor wafer 10 and the glass substrate 20, a separate process may be performed of causing additional resin to adhere to the side surface 10c of the semiconductor wafer 10, to increase the amount of resin 30a, and then perform processing to shape the resin 30a into a prescribed shape.

The resin 30a may be the same material as that used in the above-described adhesion layer 30, or may be a different material.

As the method of causing resin 30a to adhere, a dispensing method, a dipping method, an inkjet method, or other method can be used, to cause selective or complete adhesion of resin along the outer perimeter of the side surface 10c of the semiconductor wafer 10.

After causing resin 30a to adhere to the side surface 10c of the semiconductor wafer 10 in this way, the vacuum in the vacuum chamber is broken.

Thereafter, the adhesion layer 30 is cured.

Figure 6C:
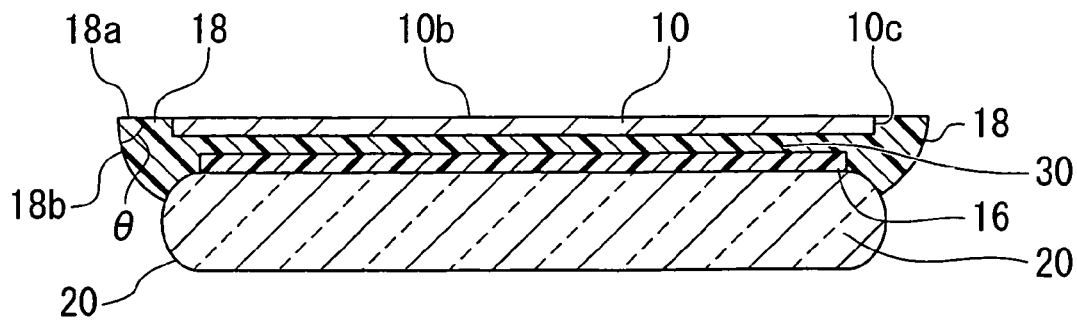

Next, as shown in FIG. 6C, the rear surface 10b of the semiconductor wafer 10 is ground by the back-grinding, in processing to reduce the thickness of the semiconductor wafer 10.

Specifically, a grinding wheel or other grinding member is brought into contact with the rear surface 10b of the semiconductor wafer 10, and while rotating the grinding member in relative motion with the semiconductor wafer 10, the rear surface 10b of the semiconductor wafer 10 is ground.

Here, while grinding the semiconductor wafer 10, the resin 30a adhering to the side surface 10c of the semiconductor wafer 10 is simultaneously ground.

That is, a single process is used to simultaneously grind the rear surface 10b of the semiconductor wafer 10 and the resin 30a adhering to the side surface 10c of the semiconductor wafer 10.

In this way, the rear surface 10b of the semiconductor wafer 10 is ground to reduce the thickness of the semiconductor wafer 10, and at the same time a protruding portion 18 of resin is formed on the side surface 10c of the semiconductor wafer 10 and on the side surface 20c of the glass substrate 20.

The protruding portion 18 has a first surface 18a, extending from the rear surface (ground surface) 10b of the semiconductor wafer 10 in the outward direction, and a second surface 18b (side surface of protruding portion), extending from a portion of the side surface 20a of the glass substrate 20 in a rounded shape to the tip of the first surface 18a.

The angle θ defined by the first surface 18a and the second surface 18b of the protruding portion 18 is an acute angle or a right angle.

After performing the grinding of the rear surface 10b of the semiconductor wafer 10, a polishing process to polish the rear surface 10b of the semiconductor wafer 10 may be performed.

In FIG. 6C, the cross-sectional shape of the side surface 18b of the protruding portion 18 is formed in a rounded shape, but as shown in FIG. 5B, the cross-sectional shape of the side surface 18b (second surface) of the protruding portion 18 may be formed in a straight shape.

As the method of the forming of the cross-sectional shape of the side surface 18b of the protruding portion 18 into a straight shape, a method of controlling the amount of resin leaking outward during lamination of the semiconductor wafer 10 and the glass substrate 20, or, a method of adjusting the amount of resin applied after lamination of the semiconductor wafer 10 and the glass substrate 20, may be employed.

The thickness of the ground semiconductor wafer 10 can be managed by using a thickness gauge employing infrared rays for monitoring.

Next, a spin-coating method is used to form a protective film in a ring shape along the outer periphery of the rear surface 20b of the glass substrate 20.

As the material of the protective film, an epoxy resin, polyimide resin or similar, having resistance to corrosion by the etching liquid described below, is used.

Figure 7A:
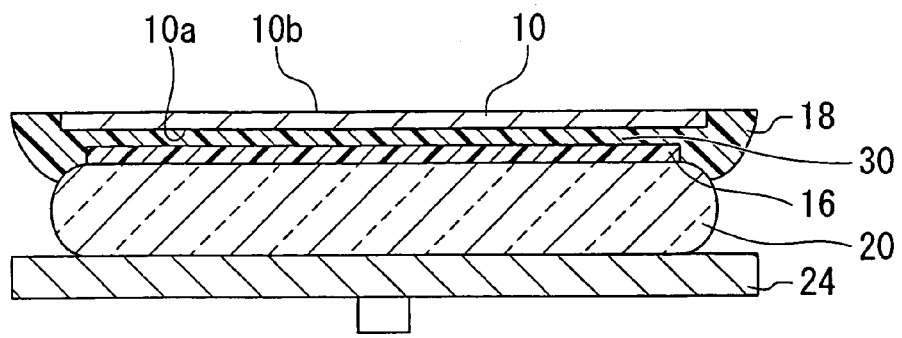
FIGS. 7A to 7D are cross-sectional views that show manufacturing processes for the semiconductor device, in the manufacturing method for the semiconductor device of a sixth embodiment.

Next, the semiconductor wafer 10 and the glass substrate 20, laminated together as described above, are transported into an etching apparatus, and as shown in FIG. 7A, the glass substrate 20 is arranged on the stage 24 with the glass substrate 20 on the lower side of the semiconductor wafer 10.

Figure 7B:
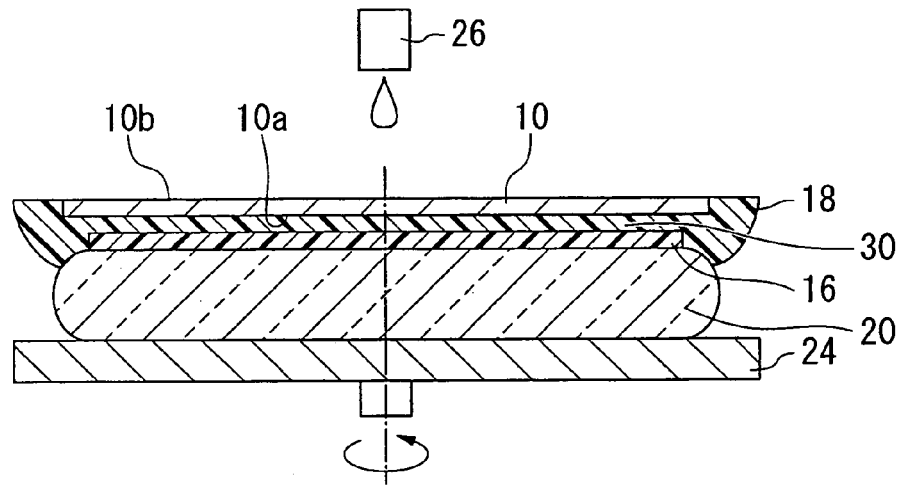

Then, as shown in FIG. 7B, the stage 24 is rotated at a rotation rate of 200 to 2000 rpm in the direction of the arrow in the figure.

After the rotation rate of the stage 24 has stabilized, etching liquid is dripped onto the rear surface 10b of the semiconductor wafer 10 from a nozzle 26 arranged above the semiconductor wafer 10.

The etching liquid dripped onto the rear surface 10b spreads toward the outer perimeter of the semiconductor wafer 10 due to the centrifugal force resulting from rotation of the semiconductor wafer 10.

On the rear surface 10b, etching liquid which has wetted and spread to the edge of the semiconductor wafer 10 wets and spreads over the protruding portion 18, and flies outward from the tip of the protruding portion 18 in the outward direction of the protruding portion 18.

At this time, air is blown from below the stage 24 toward the semiconductor wafer 10.

By means of this spin etching, contact of the etching liquid with the active surface 10a of the semiconductor wafer 10 can be prevented, and recovery of etching liquid is improved.

Here, as the etching liquid, a mixture of hydrofluoric acid and nitric acid is used.

In the liquid mixture, if the content by weight concentration of hydrofluoric acid is 20% or less, and in particular if the hydrofluoric acid concentration is from 5 to 15%, then the flatness of the semiconductor wafer 10 after spin etching is improved.

In order to secure uniform the thickness of the semiconductor wafer 10 after spin etching, the nozzle 26 is arranged above the semiconductor wafer 10, and can be moved at a prescribed velocity and over a prescribed range, and enables adjustment of the amount of etching liquid dripped.

As explained above, the rear surface 10b of the semiconductor wafer 10 is chemically spin-etched.

By performing such spin etching, cracks and similar in the damaged layer occurring on the rear surface 10b of the semiconductor wafer 10 due to the above-described grinding processing are removed, finishing processing of the rear surface 10b of the semiconductor wafer 10 is performed, and the thickness of the semiconductor wafer 10 is reduced.

Next, spin etching is performed until the thickness of the semiconductor wafer 10 reaches a prescribed thickness, after the thickness of the semiconductor wafer 10 has been reduced to the prescribed thickness, the supply of etching liquid from the nozzle 26 is halted.

Then, a rinsing liquid is supplied onto the rear surface 10b of the semiconductor wafer 10 in order to remove the etching liquid remaining on the rear surface 10b of the semiconductor wafer 10.

As the rinsing liquid, pure water, ozone water, or similar is preferable.

Next, dicing tape is affixed to the entire rear surface 10b of the semiconductor wafer 10.

Then, the glass substrate 20 and the semiconductor wafer 10 are divided.

Figure 7C:
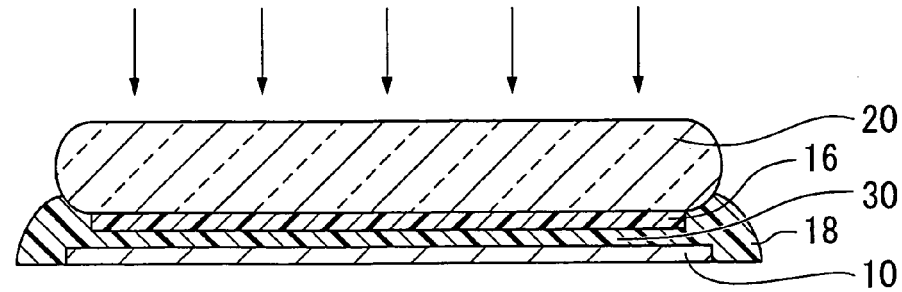

As a specific example of a method of dividing the glass substrate 20 from the semiconductor wafer 10, a method of irradiating the glass substrate 20 with laser light from above the glass substrate 20, as shown in FIG. 7C, may be used.

The laser light irradiates the separation layer 16 through the transparent glass substrate 20.

By this means, the adhesive properties of the separation layer 16 are diminished, and the glass substrate 20 can be divided from the semiconductor wafer 10.

Here, as the laser light, light from a $CO_2$ laser (wavelength 106 nm) or YAG laser (wavelength 1064 nm), the second harmonic of a YAG laser (wavelength 532 nm), or laser light from a semiconductor laser (wavelength 780 to 1300 nm), or similar, can be used.

Next, the adhesion layer 30 adhering to the active surface 10a of the semiconductor wafer 10 is removed.

As the method of removing, for example, a mechanical stripping method can be used.

After mechanical stripping, a solvent or similar may be used to remove the adhesion layer 30 remaining on the active surface 10a of the semiconductor wafer 10.

In order to prevent cracking of the semiconductor wafer 10 during removal, the adhesion layer 30 may be dissolved in solvent or similar to divide the semiconductor wafer 10 and the glass substrate 20.

Finally, the protective film formed on the rear surface 20b of the glass substrate 20 is separated.

As the method of the separating of the protective film, similarly to methods for separating the adhesion layer 30, a solvent can be used to dissolve and remove the protective film.

A glass substrate 20 divided from the semiconductor wafer 10 in this way can be reused, and can again be employed in processing to reduce the thickness of another semiconductor wafer 10.

Figure 7D:
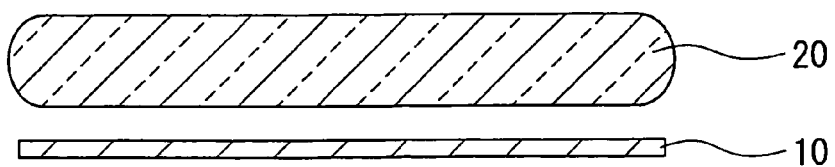

By means of the above processing, as shown in FIG. 7D, a semiconductor wafer 10 processed to reduce the thickness is obtained.

Finally, a dicing-blade is used to cut the semiconductor wafer in the dicing regions S shown in FIG. 1A, to divide the semiconductor wafer 10 into each of the semiconductor regions 60, to obtain the individual semiconductor devices.

According to this embodiment, when laminating the semiconductor wafer 10 and the glass substrate 20, the semiconductor wafer 10 is arranged below the glass substrate 20, so that adhesive 30a (resin) which leaks outward from the edges of the semiconductor wafer 10 and the glass substrate 20 adheres along the side surface 10c of the semiconductor wafer 10 which is arranged below.

Hence in the process of the back-grinding of the rear surface 10b of the semiconductor wafer 10, the adhesive 30a adhering to the side surface 10c of the semiconductor wafer 10 is simultaneously ground, so that the protruding portion 18 can be formed on the side surface 10c of the semiconductor wafer 10.

By this means, contact of the etching liquid with the rear surface 20b of the glass substrate 20 can be avoided, and damage to the rear surface 20b of the glass substrate 20 can be prevented.

Furthermore, by preventing damage to the glass substrate 20, it is possible to reuse the glass substrate 20, so that the costs incurred in processing to reduce the thickness of the semiconductor wafer 10 can be lowered.

Seventh Embodiment

Below, a seventh embodiment of the invention is explained, referring to the drawings.

In this embodiment, components which are the same as the components in the above-described first through sixth embodiments are assigned the same reference symbols, and explanations are omitted.

Moreover, explanations of the same manufacturing processes as in the above-described first through sixth embodiments are omitted.

In this embodiment, the method of forming of a protruding portion 18 is described in detail, and the process of rendering the semiconductor wafer 10 into a thin film is explained.

FIGS. 8A to 8E are cross-sectional views showing semiconductor device manufacturing processes of this embodiment.

In FIGS. 8A to 8E, the semiconductor wafer 10 is shown schematically.

Figure 8A:
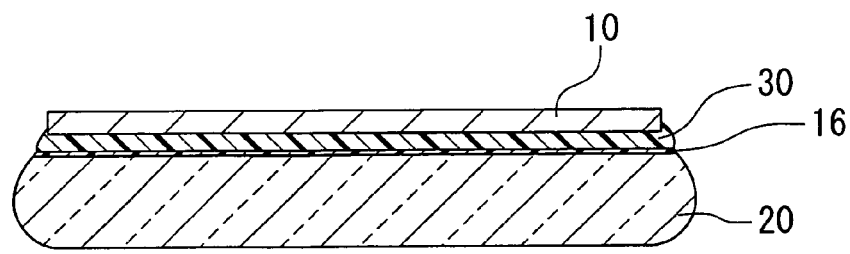
FIGS. 8A to 8E are cross-sectional views that show manufacturing processes for the semiconductor device, in the manufacturing method for the semiconductor device of a seventh embodiment.

First, as shown in FIG. 8A, the semiconductor wafer 10 is laminated onto the glass substrate 20 via the adhesion layer 30 and the separation layer 16 intervening.

Next, the rear surface 10b of the semiconductor wafer 10 is ground by the back-grinding, in processing to reduce the thickness of the semiconductor wafer 10.

At this time, the damaged layer including cracks and similar is formed on the rear surface 10b of the semiconductor wafer 10 by back-grinding.

Figure 8B:
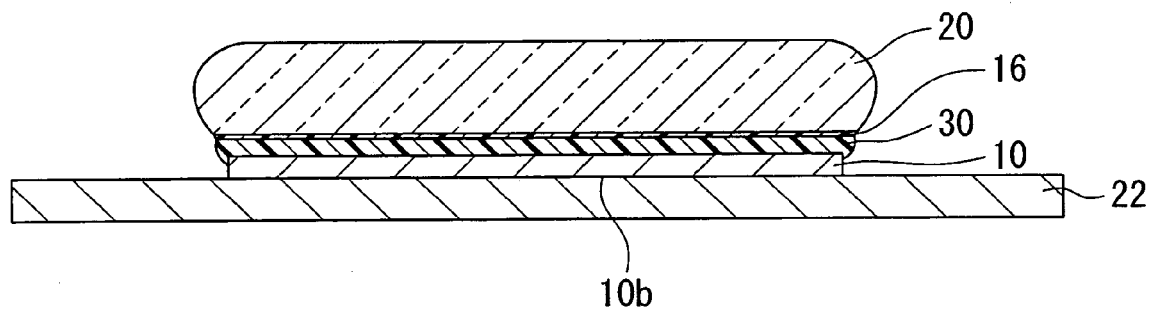

Next, as shown in FIG. 8B, the rear surface 10b (ground surface) of the semiconductor wafer 10 is arranged downward, and the rear surface 10b is arranged in contact with a table 22.

As the material of the table 22, a material with minimal adhesion to resin material is used.

The surface of the table 22 on which the semiconductor wafer 10 is arranged is treated with Teflon (a registered trademark) so as to facilitate separation of the semiconductor wafer 10 from the table 22.

Figure 8C:
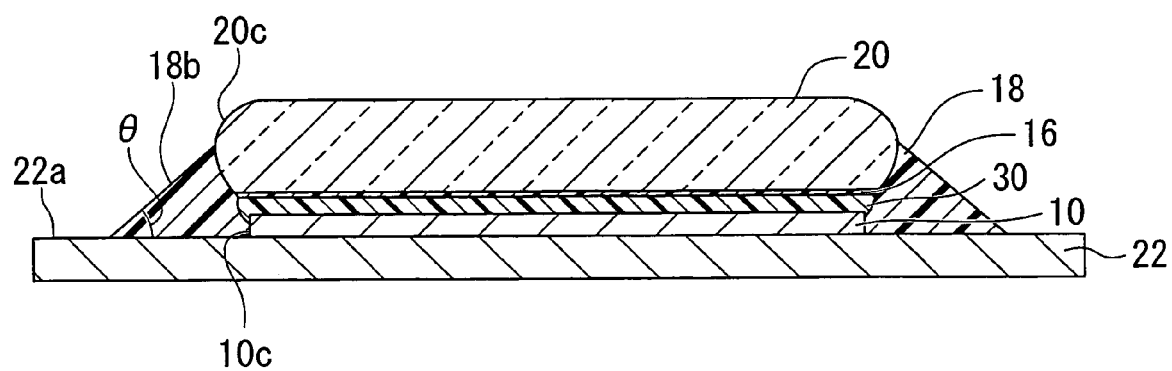

Next, as shown in FIG. 8C, a protruding portion 18 is formed so as to cover the side surface 10c of the semiconductor wafer 10 and a portion of the side surface 20c of the glass substrate 20.

The protruding portion 18 is formed along a portion of the outer perimeter of the side surface 10c of the semiconductor wafer 10 and the side surface 20c of the glass substrate 20.

At this time, a dispensing method, an inkjet method, or a dipping method is used as the method of the forming of the protruding portion 18.

When forming the protruding portion 18, the angle θ defined by the upper surface 22a of the table 22 and the side surface 18b of the resin 18 is formed to be an acute angle.

As the material of the protruding portion 18, it is desirable that a silicone resin, polyimide resin, Teflon (a registered trademark) resin, or other material with excellent resistance to chemicals be used.

After hardening (curing) the protruding portion 18, the semiconductor wafer 10 and the glass substrate 20 are divided from the table 22.

Figure 8D:
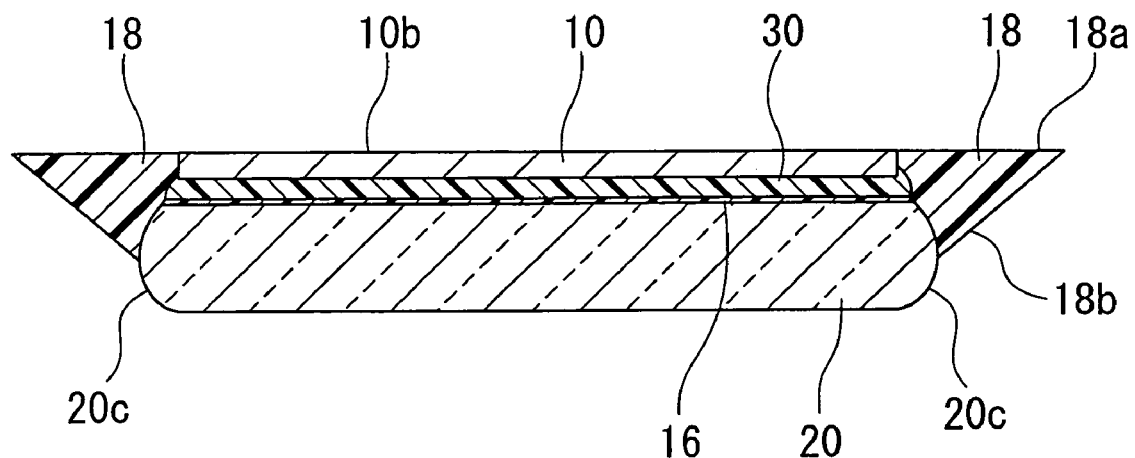

By this means, a protruding portion 18 is formed on the side surface 10c of the semiconductor wafer 10 and the side surface 20c of the glass substrate 20, as shown in FIG. 8D.

The protruding portion 18 has a first surface 18a, which extends from the rear surface 10b (ground surface) of the semiconductor wafer 10 in the outward direction, and a second surface 18b (side surface of the protruding portion), which extends from a portion of the side surface 20a of the glass substrate 20 to the tip of the first surface 18a.

The angle defined by the first surface 18a and the second surface 18b of the protruding portion 18 is formed to be an acute angle or a right angle.

Figure 8E:
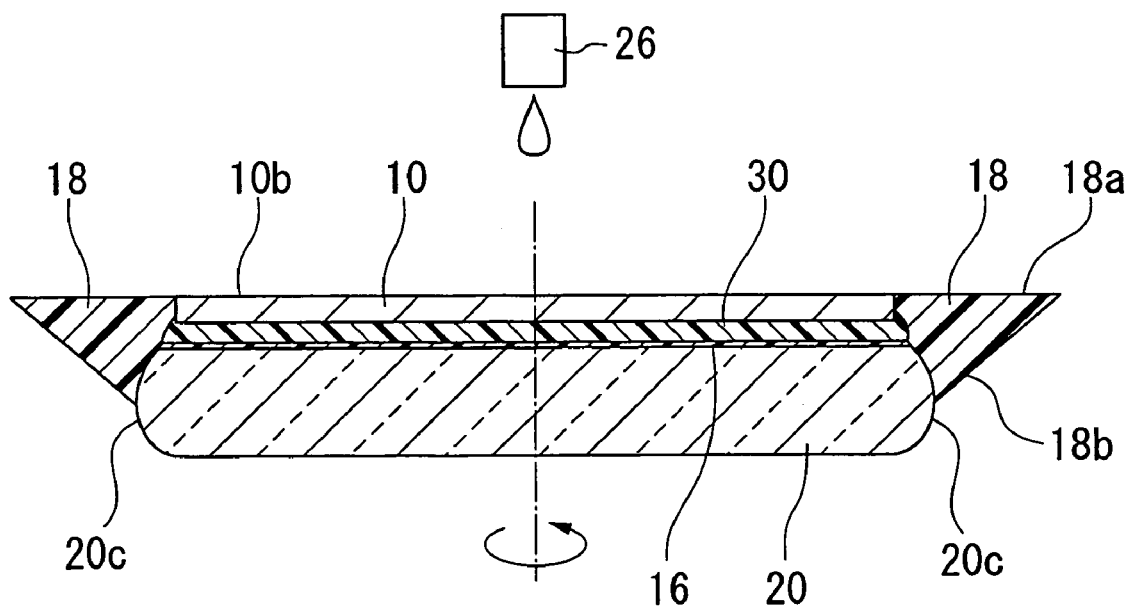

Next, as shown in FIG. 8E, spin etching of the rear surface 10b of the semiconductor wafer 10 is performed.

In the spin etching process, the semiconductor wafer 10 and the glass substrate 20 remain laminated together, and while rotating the semiconductor wafer 10, etching liquid is dripped onto the rear surface 10b of the semiconductor wafer 10.

Here, etching liquid is dripped onto the rear surface 10b of the semiconductor wafer 10 from a nozzle 26 arranged above the semiconductor wafer 10.

The etching liquid dripped onto the rear surface 10b spreads toward the outer perimeter of the semiconductor wafer 10 due to the centrifugal force resulting from rotation of the semiconductor wafer 10.

On the rear surface 10b, etching liquid which has wetted and spread to the edge of the semiconductor wafer 10 wets and spreads over the first surface 18a of the protruding portion 18, and flies outward from the tip of the first surface 18a in the outward direction of the protruding portion 18.

In this spin etching process, air is blown from below the glass substrate 20 toward the glass substrate 20.

Air blown toward the glass substrate 20 is blown against the rear surface 20b of the glass substrate 20 on the side opposite the adhesion surface 20a, the side surface 20c of the glass substrate 20, and the second surface 18b of the protruding portion 18.

Here, the air blown against the second surface 18b of the protruding portion 18 flows in the direction along the second surface 18b of the protruding portion 18.

Hence air blown from below the glass substrate 20 toward the glass substrate 20 is blown against the entire side surface 20c of the glass substrate 20 and the entire second surface 18b of the protruding portion 18.

As a result, the areas of the second surface 18b of the protruding portion 18 and the side surface 20c of the glass substrate 20 against which air is blown are increased.

Next, the protruding portion 18 is removed.

Then, as explained in FIG. 7C, laser light emitted from above the glass substrate 20 toward the glass substrate 20 passes through the glass substrate 20 to irradiate the separation layer 16.

By this means, the adhesive properties of the separation layer 16 are diminished, and the semiconductor wafer 10 can be divided from the glass substrate 20.

Next, the adhesion layer 30 adhering to the active surface 10a of the semiconductor wafer 10 is separated.

Through the above processes, a semiconductor wafer 10 processed to reduce the thickness is obtained, as shown in FIG. 7D.

Finally, a dicing-blade is used to cut the semiconductor wafer in the dicing regions S shown in FIG. 1A, to divide the semiconductor wafer 10 into each of the semiconductor regions 60, to obtain the individual semiconductor devices.

According to this embodiment, by adjusting the amount of resin arranged on the table 22, a protruding portion 18 having a desired angle as described above can be formed on the side surface 10c of the semiconductor wafer 10 and the side surface 20c of the glass substrate 20.

This invention is not limited to the above-described examples, and various modifications can of course be made without deviating from the subject matter in the invention.

Moreover, the configurations described in the above embodiments can be combined without deviating from the subject matter in the invention.

For example, in the above-described embodiments, a protruding portion 18 is formed on the side surface 10c of the semiconductor wafer 10 and the side surface 20c of the glass substrate 20, but other configurations are possible.

A protruding portion 18 can also be formed on at least one among the side surface 10c of the semiconductor wafer 10 and the side surface 20c of the glass substrate 20.

Also, using the semiconductor wafer 10 explained in the first embodiment, spin etching can be employed to etch the rear surface 10b of the semiconductor wafer 10, after which the semiconductor regions 60 formed on the semiconductor wafer 10 can each be divided, to obtain the individual semiconductor devices.

Also, in the state in which the semiconductor wafer 10 is laminated to a glass substrate 20 as explained in the above-described second embodiment, the above-described third embodiment, the above-described fourth embodiment, and the above-described fifth embodiment, after using spin etching to etch the rear surface 10b of the semiconductor wafer 10, the semiconductor regions 60 formed on the semiconductor wafer 10 can each be divided, to obtain the individual semiconductor devices.

In the above sixth embodiment, after using back-grinding in the process to reduce the thickness of the semiconductor wafer 10, the semiconductor wafer 10 is arranged on a table 22, but other methods are possible.

For example, the following method may be used.

Prior to the back-grinding of the semiconductor wafer 10, the semiconductor wafer 10 is arranged on the table 22, and resin is caused to adhere to the side surface 10c of the semiconductor wafer 10.

Then, the semiconductor wafer 10 is divided from the table 22, and simultaneous back-grinding of the semiconductor wafer 10 and the resin is performed.

By this means, the thickness of the semiconductor wafer 10 is reduced, and a protruding portion 18 is formed on the side surface 10c of the semiconductor wafer 10.

What is claimed is:

1. A manufacturing method for a semiconductor device, comprising:
    preparing a semiconductor wafer having an active surface, a side surface, a rear surface on the side opposite the active surface, and a plurality of semiconductor elements formed on the active surface;
    forming the side surface of the semiconductor wafer so that an angle defined by the entire side surface of the semiconductor wafer and the rear surface of the semiconductor wafer becomes an acute angle; and
    performing a spin etching in which etching liquid is dripped onto the rear surface of the semiconductor wafer while blowing air from below toward the active surface of the semiconductor wafer and toward the side surface of the semiconductor wafer and while rotating the semiconductor wafer.

2. A manufacturing method for a semiconductor device, comprising:
    preparing a semiconductor wafer having an active surface, a side surface, a rear surface on the side opposite the active surface, and a plurality of semiconductor elements formed on the active surface;
    preparing a supporting substrate supporting the semiconductor wafer and having a facing surface facing the active surface of the semiconductor wafer, a side surface, and a rear surface on the opposite side of the facing surface;
    connecting the semiconductor wafer and the supporting substrate via an adhesive while facing the active surface of the semiconductor wafer and the facing surface of the supporting substrate;
    forming the side surface of the semiconductor wafer and the side surface of the supporting substrate so that at least one among a first angle defined by at least a portion of the side surface of the semiconductor wafer and the rear surface of the semiconductor wafer, and a second angle defined by at least a portion of the side surface of the supporting substrate and the facing surface of the supporting substrate becomes an acute angle or a right angle; and
    performing a spin etching in which etching liquid is dripped onto the rear surface of the semiconductor wafer while blowing air toward the rear surface of the supporting substrate and toward the side surface of the supporting substrate and while rotating the semiconductor wafer.

3. The manufacturing method for a semiconductor device according to claim 2, wherein the first angle and the second angle are defined such that the side surface of the semiconductor wafer and the side surface of the supporting substrate are positioned in the same plane.

4. A manufacturing method for a semiconductor device, comprising:
    preparing a semiconductor wafer having an active surface, a side surface, a rear surface on the side opposite the active surface, and a plurality of semiconductor elements formed on the active surface;
    preparing a supporting substrate supporting the semiconductor wafer and having a facing surface facing the active surface of the semiconductor wafer and a side surface;
    connecting the semiconductor wafer and the supporting substrate via an adhesive while facing the active surface of the semiconductor wafer and the facing surface of the supporting substrate;
    forming, on at least one among the side surface of the semiconductor wafer and the side surface of the supporting substrate, a protruding portion having a first surface extending in the outward direction of the semiconductor wafer from a portion of the side surface of the semiconductor wafer, and a second surface extending from a portion of the side surface of the supporting substrate to the tip portion of the first surface;
    forming the side surface of the semiconductor wafer so that an angle defined by the first surface and the second surface of the protruding portion becomes an acute angle or a right angle; and
    performing a spin etching in which etching liquid is dripped onto the rear surface of the semiconductor wafer while blowing air from below the supporting substrate toward the supporting substrate and while rotating the semiconductor wafer.

5. The manufacturing method for a semiconductor device according to claim 4, wherein the first surface and the rear surface of the semiconductor wafer are formed such that the first surface and the rear surface of the semiconductor wafer are positioned in the same plane.

6. The manufacturing method for a semiconductor device according to claim 4, wherein the material of the protruding portion includes a resin.

7. The manufacturing method for a semiconductor device according to claim 4, wherein the protruding portion is formed along the outer perimeter of at least one among the side surface of the semiconductor wafer and the side surface of the supporting substrate.

8. A manufacturing method for a semiconductor device, comprising:
    preparing a semiconductor wafer having an active surface, a side surface, a rear surface on the side opposite the active surface, and a plurality of semiconductor elements formed on the active surface;

preparing a supporting substrate supporting the semiconductor wafer and having a facing surface facing the active surface of the semiconductor wafer and a side surface;

arranging an adhesive on at least one among the active surface of the semiconductor wafer and the facing surface of the supporting substrate;

arranging the semiconductor wafer on the lower side of the supporting substrate;

connecting the semiconductor wafer and the supporting substrate via the adhesive;

performing a back-grinding in which the adhesive leaking from between the semiconductor wafer and the supporting substrate and the rear surface of the semiconductor wafer are ground, wherein a protruding portion made of the leaked adhesive is formed on at least one among the side surface of the semiconductor wafer and the side surface of the supporting substrate;

performing a spin etching in which etching liquid is dripped onto the rear surface of the semiconductor wafer while blowing air from below the supporting substrate toward the supporting substrate and while rotating the semiconductor wafer; and dividing the semiconductor wafer and the supporting substrate after the performing of the spin etching.

9. The manufacturing method for a semiconductor device according to claim 8, further comprising:

arranging a resin on at least one among the side surface of the semiconductor wafer and the side surface of the supporting substrate after connecting the semiconductor wafer and the supporting substrate.

10. A manufacturing method for a semiconductor device, comprising:

preparing a semiconductor wafer having an active surface, a side surface, a rear surface on the side opposite the active surface, and a plurality of semiconductor elements formed on the active surface;

preparing a supporting substrate supporting the semiconductor wafer and having a facing surface facing the active surface of the semiconductor wafer and a side surface;

forming a laminated structure by facing the active surface of the semiconductor wafer and the facing surface of the supporting substrate, and by connecting the semiconductor wafer and the supporting substrate via an adhesive;

performing a back-grinding in which the rear surface of the semiconductor wafer is ground;

arranging the laminated structure on a table while facing the rear surface of the semiconductor wafer to the table;

forming a protruding portion by arranging a resin on at least one among the side surface of the semiconductor wafer and the side surface of the supporting substrate;

dividing the laminated structure from the table;

performing a spin etching in which etching liquid is dripped onto the rear surface of the semiconductor wafer while blowing air from below the supporting substrate toward the supporting substrate and while rotating the semiconductor wafer; and dividing the semiconductor wafer and the supporting substrate after the performing of the spin etching.

11. The manufacturing method for a semiconductor device according to claim 10, wherein an angle defined by a surface of the table on which the laminated structure is arranged and a side surface of the protruding portion, is an acute angle or a right angle.

* * * * *